United States Patent
Kaufmann

(10) Patent No.: US 10,043,924 B1
(45) Date of Patent: Aug. 7, 2018

(54) LOW COST OPTICAL SENSOR PACKAGE

(71) Applicant: Maxim Integrated Products, Inc., San Jose, CA (US)

(72) Inventor: Matthew V. Kaufmann, Morgan Hill, CA (US)

(73) Assignee: Maxim Integrated Products, Inc., San Jose, CA (US)

(*) Notice: Subject to any disclaimer, the term of this patent is extended or adjusted under 35 U.S.C. 154(b) by 157 days.

(21) Appl. No.: 14/017,373

(22) Filed: Sep. 4, 2013

Related U.S. Application Data

(60) Provisional application No. 61/732,981, filed on Dec. 4, 2012.

(51) Int. Cl.
| | |
|---|---|
| *H01L 31/0232* | (2014.01) |
| *H01L 33/58* | (2010.01) |
| H01L 31/0216 | (2014.01) |
| H01L 31/054 | (2014.01) |

(52) U.S. Cl.
CPC ......... *H01L 31/0232* (2013.01); *H01L 33/58* (2013.01); *H01L 31/02162* (2013.01); *H01L 31/02325* (2013.01); *H01L 31/054* (2014.12)

(58) Field of Classification Search
CPC .............. H01L 31/0232; H01L 33/58; H01L 31/02325; H01L 31/02162; H01L 31/054
USPC ............................ 257/98, 431–435
See application file for complete search history.

(56) References Cited

U.S. PATENT DOCUMENTS

| | | | |
|---|---|---|---|
| 6,503,780 B1* | 1/2003 | Glenn | H01L 27/14618 438/106 |
| 7,199,438 B2* | 4/2007 | Appelt et al. | 257/433 |
| 2005/0009239 A1* | 1/2005 | Wolff | H01L 27/14618 438/123 |
| 2009/0212382 A1* | 8/2009 | Lim et al. | 257/433 |
| 2010/0155917 A1* | 6/2010 | Maruo | H01L 27/14618 257/680 |
| 2010/0193240 A1* | 8/2010 | Takayama | H01L 23/3121 174/521 |

\* cited by examiner

*Primary Examiner* — Thanh T Nguyen
(74) *Attorney, Agent, or Firm* — Kevin E. West; Advent, LLP

(57) ABSTRACT

Optical sensor packages include a substrate assembly such as a leadframe or semiconductor substrate. One or more optical devices are mounted to the substrate assembly. One or more optical overlays are disposed (e.g., stacked) on the active side of the optical device(s), and mounted to the device(s) using an adhesive layer. In embodiments, the optical devices may comprise optical sensors (e.g., photo-detector such as phototransistors or photodiodes), light sources (e.g., light emitting diodes (LED), combinations thereof, and so forth. A mold layer is formed over the substrate assembly, proximate to the optical device and optical overlay so that an outer surface of the optical overlay is exposed.

15 Claims, 7 Drawing Sheets

(12) United States Patent
US 10,043,924 B1

LOW COST OPTICAL SENSOR PACKAGE

BACKGROUND

Electronic devices, such as smart phones, tablet computers, digital media players, and so forth, increasingly employ optical sensors to control the manipulation of a variety of functions provided by the device. For example, optical sensors are commonly used by electronic devices to detect ambient lighting conditions in order to control the brightness of the device's display screen. Similarly, optical sensors are commonly used in proximity and gesture sensing applications. Proximity and gesture sensing enables the detection of physical movement (e.g., "gestures") without the user actually touching the device within which the sensing device resides. The detected movements can be subsequently used as input commands for the device.

SUMMARY

Techniques are described for fabricating a low cost optical sensor package that includes an optical device such as an optical sensor or light source, and an optical overlay placed over the optical device. In implementations, the optical sensor packages include a substrate assembly such as a leadframe or semiconductor substrate. One or more optical devices are mounted to the substrate assembly. One or more optical overlays are disposed (e.g., stacked) on the active side of the optical device(s), and mounted to the device(s) using an adhesive. In embodiments, the optical devices may comprise optical sensors (e.g., photodetector such as phototransistors or photodiodes), light sources (e.g., light emitting diodes (LED)), combinations thereof, and so forth. A mold layer is formed over the substrate assembly, proximate to the optical device and optical overlay so that an outer surface of the optical overlay is exposed and that the sensors and/or light sources are optically isolated.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIG. 1A is a diagrammatic partial cross-sectional side elevation view illustrating an optical sensor package in accordance with example implementations of the present disclosure, wherein the optical sensor package employs a single device configuration having a substrate assembly, an optical device mounted to the substrate assembly via wire bonding interconnection techniques, an adhesive layer, an optical overlay, and a mold layer surrounding the optical device and optical overlay so that the outer surface of the optical overlay is exposed.

FIG. 1B is a diagrammatic partial cross-sectional side elevation view illustrating an optical sensor package in accordance with example implementations of the present disclosure, wherein the optical sensor package employs a single device configuration having a substrate assembly, an optical device mounted to the substrate assembly via film-on-wire bonding interconnection techniques, a thin film adhesive, an optical overlay, and a mold layer surrounding the optical device and optical overlay so that the outer surface of the optical overlay is exposed.

FIG. 1C is a diagrammatic partial cross-sectional side elevation view illustrating an optical sensor package in accordance with example implementations of the present disclosure, wherein the optical sensor package employs a single device configuration having a substrate assembly, an optical device mounted to the substrate assembly via flip chip (controlled collapse chip connection (C4)) interconnection techniques, an adhesive layer, an optical overlay, and a mold layer surrounding the optical device and optical overlay so that the outer surface of the optical overlay is exposed.

FIG. 1D is a diagrammatic partial cross-sectional side elevation view illustrating an optical sensor package in accordance with example implementations of the present disclosure, wherein the optical sensor package includes a multiple device configuration having two or more optical devices wherein one of the optical devices is illustrated as being mounted to the substrate assembly via wire bonding interconnection techniques.

FIG. 1E is a diagrammatic partial cross-sectional side elevation view illustrating an optical sensor package in accordance with example implementations of the present disclosure, wherein the optical sensor package includes a multiple device configuration having two or more optical devices wherein at least one of the optical devices is illustrated as being mounted to the substrate assembly via flip chip (controlled collapse chip connection (C4)) interconnection techniques.

DETAILED DESCRIPTION

Overview

Figure 1A:
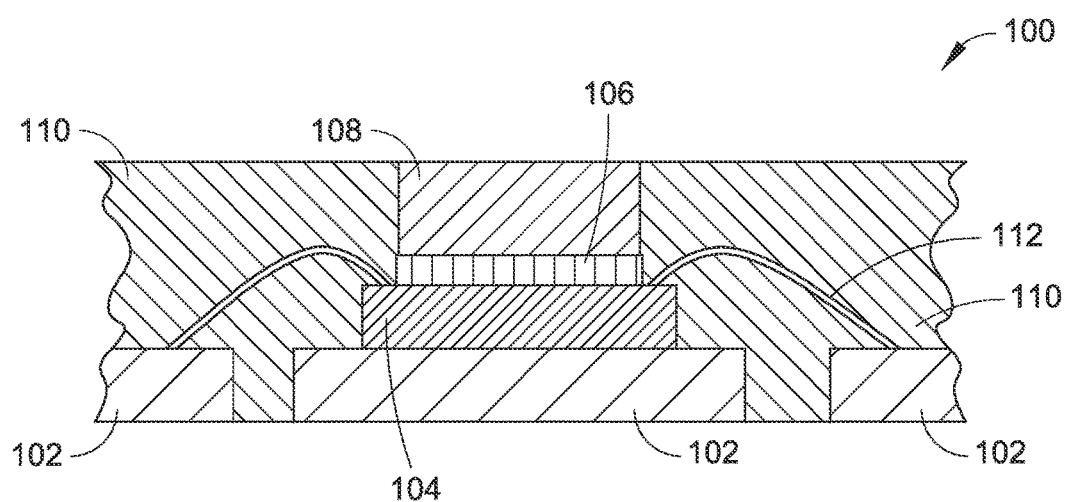

Current packaging solutions for optical sensors are very complex with complicated package constructions, significant tooling costs, and marginal reliability. Optical sensors often require that the sensor die be "visually" exposed to the external environment. Current methods and materials relating to optical devices can be expensive and difficult to integrate into a typical electronic package construction without significantly increasing the complexity of the assembly process as well as a significant increase in tooling charges associated with the assembly technology.

Accordingly, packaging techniques are described for fabricating an optical sensor package that includes one or more optical devices such as optical sensors or light sources and one or more optical overlays (e.g., a glass window, a lens, a color filter, an infrared (IR) filter, etc.) placed over the optical device(s) using a stacked die assembly process. The optical overlay(s) are stacked using methods that avoid custom tooling requirements and enable the use of packaging materials with proven high reliability.

In implementations, an optical overlay is placed on the optical device, and attached to the device via an adhesive (e.g., a transparent epoxy or polymer-based film). Subsequently, this stacked configuration may be molded and/or encapsulated with a mold compound. In some implementations, the optical sensor package may employ flip chip (controlled collapse chip connection (C4)) interconnection techniques, and/or may employ backside interconnect configurations using through-silicon via (TSV) technology to connect the optical device to a leadframe or processed substrate.

Example Implementations

FIGS. 1A through 1E illustrate optical sensor packages 100 in accordance with example implementations of the present disclosure. As shown, the optical sensor packages 100 include a substrate assembly 102. One or more optical devices 104 are mounted to the substrate assembly 102. One or more optical overlays 108 are disposed (e.g., stacked) on the active side of the optical device(s) 104, and mounted to the device(s) using an adhesive layer 106. A mold layer 110 is formed over the substrate assembly 102 proximate to the optical device(s) 104 and optical overlay(s) 108 so that an outer surface of the optical overlay 108 is exposed (e.g., is not substantially covered by mold material).

In embodiments, the optical sensor packages 100 may comprise flat no-leads packages such as quad-flat no-leads (QFN) packages, dual-flat no-leads (DFN) packages, and so forth but the implementation is not limited to these package types. In such embodiments, the substrate assembly 102 may comprise a leadframe having a plurality of contact pads or leads and a thermal pad on which the optical device(s) 104 rest. The leadframe serves as a metal frame structure used as a skeleton support for the optical device 104. In implementations, a chip-on-lead leadframe structure, where there is no thermal pad and the optical device rests on the actual leads of the leadframe, may be used. In other embodiments, the substrate assembly 102 may comprise a semiconductor substrate. In such embodiments, the substrate assembly 102 may be fabricated as a portion of (e.g., singulated from) a semiconductor wafer, such as a silicon wafer, a germanium wafer, and so forth, and may include one or more integrated circuits formed therein. In further embodiments, it is contemplated that the substrate assembly 102 may comprise a printed circuit board, or other suitable substrate.

In implementations, the optical device(s) 104 may comprise optical sensors (e.g., photodetectors such as phototransistors or photodiodes, and so forth), light sources (e.g., light emitting diodes (LED)), combinations thereof, and so forth. As shown, the optical device(s) 104 are disposed on the substrate assembly 102. For example, in embodiments, the optical device(s) may be mounted directly on the surface of the substrate assembly 102 (e.g., directly to a leadframe). However, it is contemplated that the optical device(s) 104 may instead be mounted on an intermediate layer or structure formed on the surface of the substrate assembly 102.

The optical sensor packages 100 include electrical interconnections 112, 114 configured to provide electrical connectivity between the substrate assembly 102 and the optical device(s) 104. The electrical interconnections may be configured in a variety of ways. For example, the optical sensor packages 100 illustrated in FIGS. 1A, 1B, and 1D employ wire bonding interconnection techniques, wherein bonding wires 112 furnish electrical interconnection between the optical device(s) 104 and the substrate assembly 102. In an implementation, shown in FIG. 1B, the bonding wires 112 may be connected using a film on wire configuration where the bonding wires 112 have a low profile and may be disposed proximate to the surfaces of the optical device 104 and/or the substrate assembly 102 (e.g., leadframe). This implementation enables the size of the optical overlay 108 to be the same size or larger than the optical sensor 104. Similarly, in FIGS. 1C, 1D, and 1E, the optical sensor packages 100 illustrated employ flip chip (controlled collapse chip connection (C4)) interconnection techniques, wherein backside interconnects (e.g., solder bump assemblies) 114 furnish electrical interconnection between the optical device(s) 104 and the substrate assembly 102. In such implementations, the optical devices 104 may be fabricated using Wafer-Level Chip Scale Packaging technologies, and/or may employ Through Substrate (Silicon) Vias (TSV) to facilitate electrical interconnection of the device(s) with the backside interconnects 114. The number and configuration of bonding wires 112 and/or backside interconnects 114 may vary depending on the complexity and configuration of the optical device(s) 104, the size and shape of the substrate assembly 102, and so forth. The electrical interconnections 112, 114 provide electrical contacts through which the optical device(s) 104 are interconnected to external components such as other optical sensor packages 100, printed circuit boards, and so forth.

The optical overlay 108 is positioned over an active side of the optical device 104. The active side of the optical device 104 may include the side that transmits, receives, and/or detects electromagnetic radiation within a desired spectrum of wavelengths, (e.g., visible light, infrared light, combinations thereof, and so forth). The optical overlay 108 comprises a structure capable of passing, absorbing, partially absorbing, blocking, or partially blocking electromagnetic radiation within a one or more spectrum of wavelengths. For example, the optical overlay 108 may comprise an optical window (e.g., a glass or plastic window), a lens, a Fresnel lens, or the like, through which a wide spectrum of electromagnetic radiation (e.g., ultraviolet light, visible light and/or infrared (IR) light) may pass. However, the optical overlay 108 may also comprise one or more filters such as a color filter (e.g., a red, green, or blue color filter), an infrared (IR) filter, and so forth, which are configured to block or absorb electromagnetic radiation within a given spectrum of wavelengths. In embodiments, the optical overlay 108 may be configured to include combination of lenses and/or filters. Moreover, while a single optical overlay 108 is illustrated over each optical device 104 illustrated in FIGS. 1A through 1E, it is contemplated that two or more optical overlays 108 may be stacked, and/or may be attached together with additional adhesive layers 106.

The optical sensor packages 100 illustrated employ an adhesive layer 106 disposed between an active side of the optical device 104 and an inner surface of the optical overlay 108 to provide a reliable attachment and/or protective interface between the optical device 104 and the optical overlay 108. In various embodiments, the adhesive layer 106 may comprise one or both of a transparent epoxy, a thin film, or a transparent adhesive film (e.g., an epoxy or film that is at least substantially transparent to electromagnetic radiation having the wavelength or spectrum of wavelengths desired to be emitted and/or received by the optical device(s) 104). However, it is contemplated that the thin film adhesive 106 may include a material with filtering properties, such as infrared filtering or visible light filtering, for example. Thus, the adhesive layer 106 may be configured to block or absorb electromagnetic radiation having a wavelength or spectrum of wavelengths passed by the optical overlay 108. The adhesive layer 106 may include a layer of material with a high surface-to-volume ratio that may be deposited on a substrate, such as the active surface of the optical device 104 or the inner surface of the optical overlay 108, by lamination, printing, thermal growing, or vapor deposition, for example. Additionally, in an implementation, an adhesive layer 106 may include an anti-reflective coating, which includes a coating configured to reduce reflection and reduce the loss of light to the optical device 104.

The mold layer 110 may cover the substrate assembly 102 and be disposed proximate to the optical device 104, adhesive layer 106, and the optical overlay 108. The mold layer 110 encapsulates the optical device 104, and may comprise plastic molding compounds, for example, which may include composite materials including epoxy resins, phenolic hardeners, silicas, catalysts, pigments, and mold release agents. In implementations, the mold layer 110 may be molded so that the optical overlay 108 is exposed during the mold compound process and the outer surface (e.g., the surface of the optical overlay 108 farthest from the optical device 104 and substrate assembly 102) is flush with the top surface (i.e., the surface farthest from the substrate assembly 102) of the mold layer 110. Molding compounds used for surface mount devices, such as the optical device 104, may be selected to have a low moisture absorption rate, a high flexural strength at board-mounting temperatures, or a combination of both in order to prevent popcorn cracking and other problems.

Figure 1B:
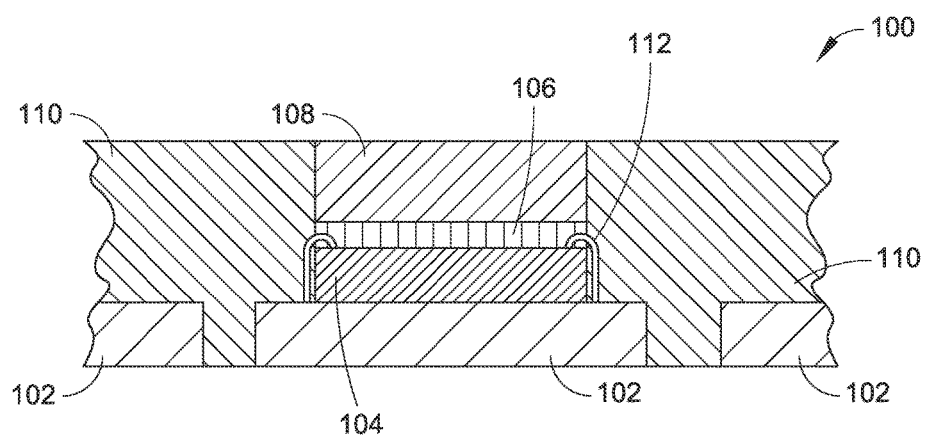
Figure 1C:
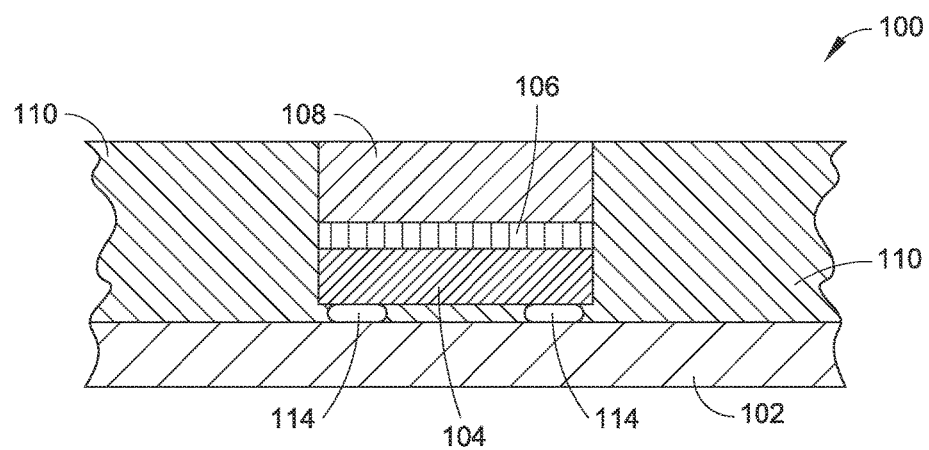

FIGS. 1A, 1B, and 1C illustrate single device configurations of the optical sensor packages 100 that include a single optical device 104, which is placed on the substrate assembly 102. As shown in FIG. 1A, the optical overlay 108 may be stacked having step-wise walls, such as in a pyramid stack configuration where the size of the optical overlay 108 may be different than the size of the optical sensor 104. Further, the optical overlay 108 may be stacked and have angled walls in relation to the adhesive layer 106 and the optical device 104 below the optical overlay 108. In this manner, the optical overlay 108 may accommodate attachment of the bonding wires to the optical device 104.

As shown in FIG. 1B, the optical sensor package 100 may employ film on wire bonding interconnection techniques so that the bonding wires 112 providing electrical interconnection between the optical device 104 and the substrate assembly 102 may be disposed within the adhesive layer 106. In this manner, the size (e.g., surface area) of the optical overlay 108 may be equal to or greater than the size (e.g., surface area) of the optical sensor 104. Thus, attachment of the bonding wires 112 may be accommodated by the thin film adhesive 106 so that a larger optical overlay 108 may be furnished.

As shown in FIG. 1C, the optical sensor package 100 illustrated employs flip chip (controlled collapse chip connection (C4)) interconnection techniques, wherein backside interconnects (e.g., solder bump assemblies) 114 furnish electrical interconnection between the optical device(s) 104 and the substrate assembly 102. In such implementations, the optical devices 104 may be fabricated using Wafer-Level Chip Scale Packaging technologies, and/or may employ Through Substrate (Silicon) Vias (TSV) to facilitate electrical interconnection of the device(s) with the backside interconnects 114. In this manner, the size (e.g., surface area) of the optical overlay 108 may be equal to or greater than the size (e.g., surface area) of the optical device 104 since bonding wires 112 need not be accounted for.

Figure 1D:
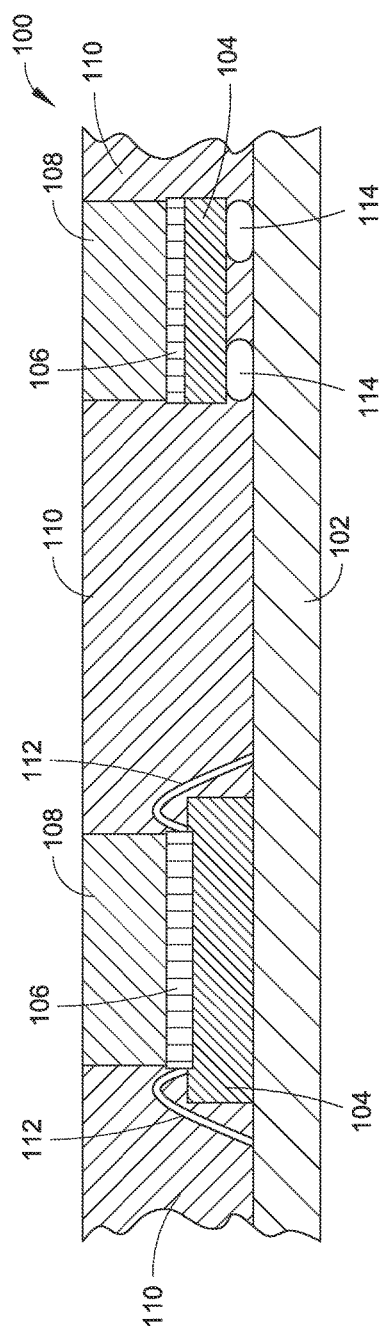
Figure 1E:
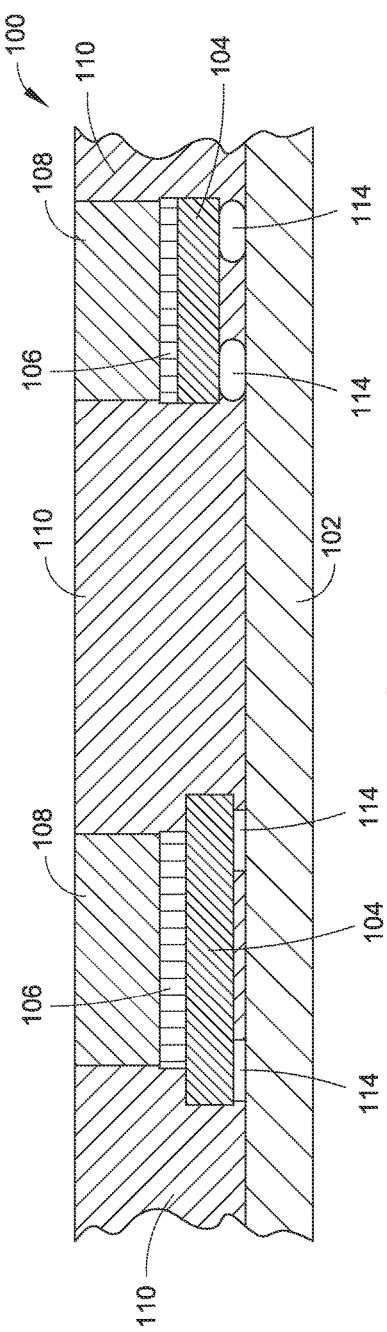

As shown in FIGS. 1D and 1E, the optical sensor packages 100 may also employ a multiple device configuration. The multiple device configurations of the optical sensor packages 100 include two or more optical devices 104, which are placed on a common substrate assembly 102. In implementations, the optical sensor packages 100 may employ various interconnection techniques, such as wire bonding interconnection techniques, film-on-wire bonding techniques, flip chip bonding techniques, and so forth. For example, in FIG. 1D, a first optical device 104 (e.g., an optical sensor) is illustrated as being interconnected with the substrate assembly 102 using wire bonding, while a second optical device 104 (e.g., a light emitting diode (LED)) is connected to the substrate assembly 102 using flip chip techniques. Similarly, in FIG. 1E, two optical devices 104 (e.g., an optical sensor and a light emitting diode) are illustrated as both being interconnected with the substrate assembly 102 using flip chip techniques. Additionally, an implementation may include an LED in its own package, which is further mounted into an optical package. As noted, the optical devices 104 may be fabricated using Wafer-Level Chip Scale Packaging technologies, and/or may employ Through Substrate (Silicon) Vias (TSV) to facilitate electrical interconnection of the device(s) with the backside interconnects 114. In this manner, the size (e.g., surface area) of the optical overlay 108 may be equal to or greater than the size (e.g., surface area) of the optical sensor 104 since bonding wires 112 need not be accounted for.

In the multi-device configurations, each optical device 104 may be in optical isolation from other optical devices 104 within the optical sensor package 100. For example, the mold layer 110 may be substantially opaque, limiting the transference of electromagnetic radiation directly between the devices 104.

Example Fabrication Processes

Figure 2:
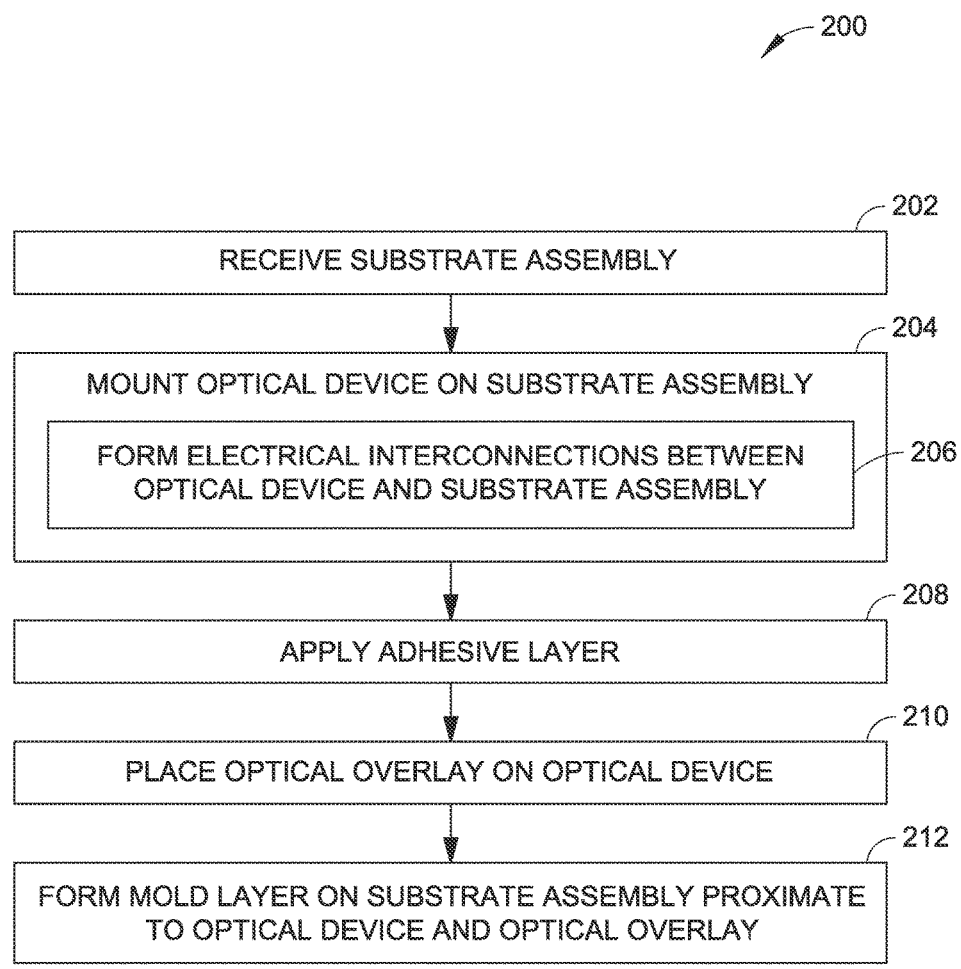
FIG. 2 is a flow diagram illustrating a process in an example implementation for fabricating optical sensor packages, such as the optical sensor packages shown in FIGS. 1A through 1E.

FIG. 2 illustrates an example process 200 that employs semiconductor packaging techniques to fabricate optical sensor packages, such as the optical sensor packages 100 shown in FIGS. 1A through 1E. FIGS. 3A through 3E illustrate a section of a substrate assembly 302 during fabrication of an example optical sensor package 300 (such as the optical sensor packages 100 shown in FIGS. 1A through 1E).

As shown in FIG. 2, a substrate assembly is received (Block 202). In the optical sensor package 300 illustrated in FIG. 3A, a section of the substrate assembly 302 is illustrated prior to placement of an optical device 304 on the substrate assembly 302. In the embodiment illustrated, the optical sensor package 300 comprises a flat no-leads package such as a quad-flat no-leads (QFN) package, a dual-flat no-leads (DFN) package, and so forth. In this embodiment, the substrate assembly 302 comprises a leadframe having a plurality of contact pads and a thermal pad on which the optical device 304 (FIG. 3B) is placed. The leadframe thus serves as a metal frame structure used as a skeleton support for the optical device 304. However, in other embodiments, the substrate assembly 302 may comprise a semiconductor substrate. In such embodiments, the substrate assembly 302 may be fabricated as a portion of (e.g., singulated from) a semiconductor wafer, such as a silicon wafer, a germanium wafer, and so forth, and may include one or more integrated circuits formed therein. In further embodiments, it is contemplated that the substrate assembly 302 may comprise a printed circuit board, or other suitable substrate.

Figure 3A:
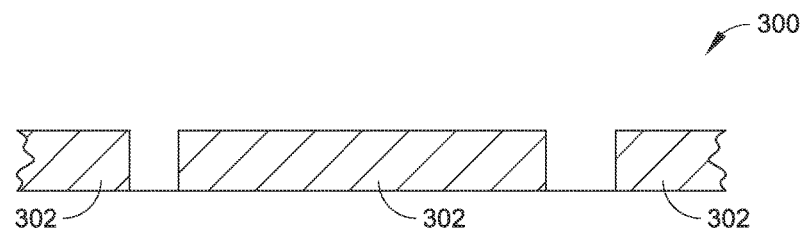
FIGS. 3A through 3E are diagrammatic partial cross-sectional side elevation views illustrating the fabrication of an optical sensor package, such as the optical sensor package shown in FIGS. 1A through 1E, in accordance with the process shown in FIG. 2.
Figure 3B:
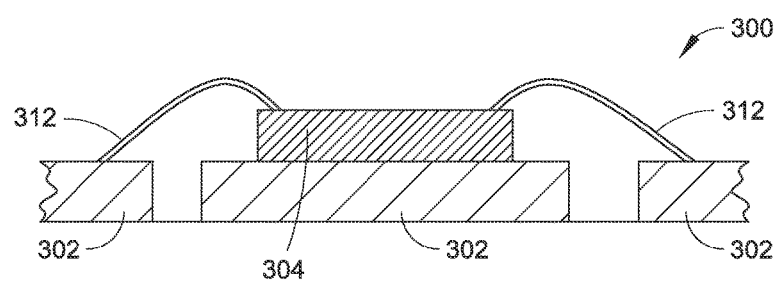
Figure 3C:
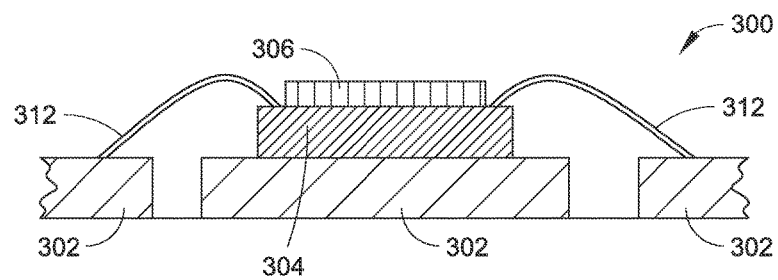

An optical device is mounted on the substrate assembly (Block 204). As noted above, the optical device 304 may comprise an optical sensor (e.g., a photodetectors such as a phototransistor or photodiode, and so forth), a light source (e.g., a light emitting diode (LED)), combinations thereof, and so forth. As shown in FIG. 3B, the optical device 304 is placed on the surface of the substrate assembly 302 (e.g., placed on the thermal pad of a lead frame). In the embodiment illustrated, the optical device is mounted directly on the surface of the substrate assembly 302 (e.g., directly to a leadframe). However, it is contemplated that the optical device 304 may instead be mounted on an intermediate layer or structure formed on the surface of the substrate assembly 302. In some implementations, the optical device 304 is attached to the substrate assembly 302 using an adhesive (e.g., adhered to the thermal pad of the lead frame).

Electrical interconnections are formed between the optical device and the substrate assembly (Block 206). The electrical interfaces are configured to provide electrical connectivity between the substrate assembly and the optical device. In FIG. 3B, wire bonding interconnection techniques are used to connect the optical device 304, wherein bonding wires 312 are attached between the optical device 304 and the substrate assembly 302 to furnish electrical interconnection between the optical device 304 and the substrate assembly 302. However as noted above, other interconnection techniques may be employed. For example, in implementations, the bonding wires 312 may be connected using a film-on-wire configuration where the bonding wires 312 have a low profile and may be disposed proximate to the surfaces of the optical device 304 and/or the substrate assembly 302 (e.g., leadframe). Similarly, in other implementations, the optical sensor package 300 can employ flip chip (controlled collapse chip connection (C4)) interconnection techniques, wherein backside interconnects (e.g., solder bump assemblies) furnish electrical interconnection between the optical device 304 and the substrate assembly 302. In such implementations, the optical device 304 may be fabricated using Wafer-Level Chip Scale Packaging technologies, and/or may employ Through Substrate (Silicon) Vias (TSV) to facilitate electrical interconnection of the device 304 with the backside interconnects. As noted, the number and configuration of bonding wires 312 (and/or backside interconnects) may vary depending on the complexity and configuration of the optical device 304, the size and shape of the substrate assembly 302, and so forth.

An adhesive layer is applied (Block 208) to provide a reliable attachment and/or protective interface between the optical device and the optical overlay. In the embodiment shown in FIG. 3C, the adhesive layer 306 is applied to an active side of the optical device 304. However, in other implementations, the adhesive layer 306 may be applied to an inner surface of the optical overlay 308 (FIG. 3D), or to both the active side of the optical device 304 and the inner surface of the optical overlay 308. For example, other implementations may include forming the adhesive layer 306 on a surface of a wafer or panel prior to singulation. In an embodiment, an adhesive layer 306 may be formed on the optical overlay 308, where the optical overlay 308 is in wafer or panel form prior to singulation. In this implementation, the singulated optical overlay 308 with the adhesive layer 306 formed on at least one side may then be placed on an optical device 304, where the side of the optical overlay 308 having the adhesive layer 306 is placed on an active side of the optical device 304. In another implementation, the optical device 304 may be attached to the adhesive layer 306 and the optical overlay 308 before being placed on the substrate assembly 302.

Figure 3D:
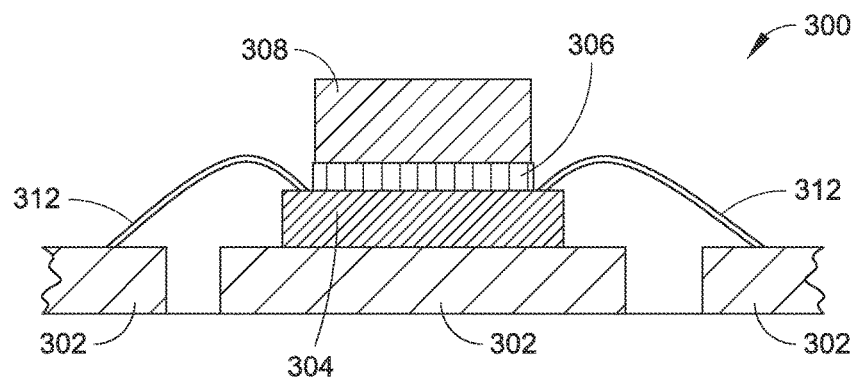

As noted, the adhesive layer 306 may comprise one or both of a transparent epoxy or a transparent adhesive film (e.g., an epoxy or film that is at least substantially transparent to electromagnetic radiation having the wavelength or spectrum of wavelengths emitted and/or received by the optical device 304). The adhesive layer 306 may also include a material with filtering properties, such as infrared filtering or visible light filtering, for example. Thus, the adhesive layer 306 may be configured to block or absorb electromagnetic radiation having a wavelength or spectrum of wavelengths passed by the optical overlay 308 (FIG. 3D). The adhesive layer 306 may include a layer of material with a high surface-to-volume ratio that may be deposited on a substrate, such as the active surface of the optical device 304 or the inner surface of the optical overlay 308, by thermal growing or vapor deposition, for example. Additionally, in an implementation, an adhesive layer 306 may include an anti-reflective coating, which includes a coating configured to reduce reflection and reduce the loss of light to the optical device 304.

An optical overlay is placed on the optical device (Block 210) with the adhesive layer disposed between the optical overlay and the optical device. For example, as shown in FIG. 3D, the optical overlay 308 is placed on the optical device 304 with the adhesive layer 306 using die stacking technology. As noted, the optical overlay 308 may comprise a structure capable of passing, absorbing, partially absorbing, blocking, or partially blocking electromagnetic radiation within a spectrum of wavelengths. For example, the optical overlay 308 may comprise an optical window (e.g., a glass or plastic window), a lens, a Fresnel lens, or the like. The optical overlay 308 may also comprise one or more filters such as a color filter (e.g., a red, green, or blue color filter), an infrared (IR) filter, and so forth. In embodiments, the optical overlay 108 may be configured to include a combination of lenses and/or filters. Moreover, while a single optical overlay 308 is illustrated as being placed over the optical device 304, it is contemplated that two or more optical overlays 308 may be stacked, and/or may be attached together with additional adhesive layers 306.

Figure 3E:
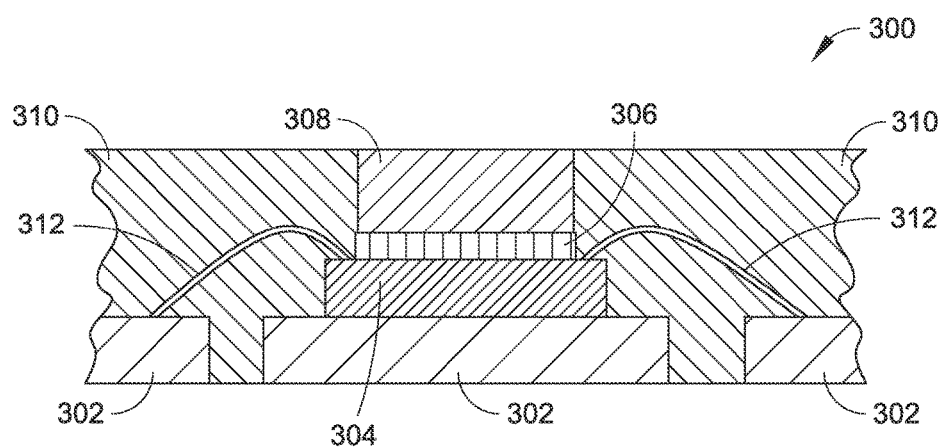

A mold layer is formed on the substrate assembly proximate to the optical device and the optical overlay (Block 212). As shown in FIG. 3E, the mold layer 310 is molded over the substrate assembly 302 using a suitable molding or plastic encapsulation process, so that the mold layer 310 at least partially encapsulates the optical device 304 and the optical overlay 308. For example, in embodiments, a molding compound may be applied to the substrate assembly 302 and hardened to form the mold layer 310. The outer surface of the optical overlay 308 (e.g., the surface farthest from the thin film adhesive 306 and the optical device 304) may be exposed during the molding process. For example, in embodiments, the outer surface of the optical overlay 308 may be masked or covered during the molding process to prevent molding compound from adhering to the surface. Similarly, in other embodiments, molding compound may be applied to the outer surface of the optical overlay 308 during the molding process, and thereafter removed. In embodiments, the mold layer 310 may be formed so that the outer surface of the optical overlay 308 is flush with the outer surface (e.g., the surface farthest from the substrate assembly 302) of the mold layer 310.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An optical sensor package, comprising:
a substrate assembly including a leadframe;
at least two optical devices disposed on the leadframe, the at least two optical devices having an active side, the at least two optical devices electrically connected to the substrate with bonding wires in a film on wire configuration, where the bonding wires are disposed proximate to the at least two optical devices;
an optical overlay disposed over the active side of the at least two optical devices, the optical overlay having an inner surface and an outer surface;
an adhesive layer disposed between the active side of the at least two optical devices and the inner surface of the optical overlay; and
a mold layer disposed proximate to the at least two optical devices and the optical overlay so that the outer surface of the optical overlay is exposed.

2. The optical sensor package as recited in claim 1, wherein the at least two optical devices are disposed on the substrate assembly in a chip-on-leadframe configuration.

3. The optical sensor package as recited in claim 1, wherein at least one of the at least two optical device comprises an optical sensor.

4. The optical sensor package as recited in claim 1, wherein at least one optical device comprises a light source.

5. The optical sensor package as recited in claim 1, wherein the adhesive layer comprises a transparent adhesive film.

6. The optical sensor package as recited in claim 1, wherein the optical overlay comprises at least one of an optical window, a lens, a color filter, or an infrared (IR) filter.

7. The optical sensor package as recited in claim 1, wherein the mold layer comprises an epoxy resin.

8. The optical sensor package as recited in claim 1, wherein the epoxy is substantially opaque.

9. An electronic device, comprising:
a printed circuit board; and
an optical sensor package, comprising:
  a substrate assembly including a leadframe;
  at least two optical devices including a first optical device and a second optical device disposed on the leadframe, each optical device having an active side, the first optical device and the second optical device electrically connected to the substrate with bonding wires in a film on wire configuration, where the bonding wires are disposed proximate to the at least two optical devices;
  at least two optical overlays, where a first optical overlay is disposed over the active side of the first optical device and a second optical overlay is disposed over the active side of the second optical device, with each optical overlay having an inner surface and an outer surface and a side that is linear in cross-section extending from the inner surface and the outer surface;
  an adhesive layer disposed between the active side of each optical device and each inner surface of each optical overlay, where the adhesive layer includes transparent epoxy; and
  a mold layer disposed proximate to each optical device and each optical overlay so that each outer surface of each optical overlay is exposed.

10. The electronic device as recited in claim 9, wherein the optical device is disposed on the substrate assembly in a chip-on-leadframe configuration.

11. The electronic device as recited in claim 9, wherein the first optical device comprises an optical sensor and the second optical device comprises a light-emitting diode.

12. The electronic device as recited in claim 9, wherein the at least two optical devices comprise at least one of an optical sensor or a light source.

13. The electronic device as recited in claim 9, wherein the adhesive layer comprises a transparent epoxy.

14. The electronic device as recited in claim 9, wherein the at least two optical overlays comprise at least one of an optical window, a lens, a color filter, or an infrared (IR) filter.

15. The electronic device as recited in claim 9, wherein the mold layer comprises an epoxy resin.

* * * * *